United States Patent

[11] 3,593,032

[72] Inventor Stephen P. F. Ma
Santa Monica, Calif.
[21] Appl. No. 884,926
[22] Filed Dec. 15, 1969
[45] Patented July 13, 1971
[73] Assignee Hughes Aircraft Company
Culver City, Calif.

[54] MOSFET STATIC SHIFT REGISTER
5 Claims, 5 Drawing Figs.

[52] U.S. Cl. 307/221, 307/223, 307/224, 307/304
[51] Int. Cl. G11c 19/00, H03k 21/00, H03k 23/08
[50] Field of Search 307/221, 223, 224, 304

[56] References Cited

UNITED STATES PATENTS

| | | | |
|---|---|---|---|
| 3,283,169 | 11/1966 | Libaw | 307/221 X |
| 3,363,115 | 1/1968 | Stephenson et al. | 307/221 X |

*Primary Examiner*—Donald D. Forrer
*Assistant Examiner*—John Zazworsky
*Attorneys*—James K. Haskell and Bernard P. Drachlis

ABSTRACT: A static serial shift register of a type that can be constructed on a single semiconductor substrate with metal oxide semiconductor field effect transistor (MOSFET) techniques which has a single RS flip-flop plus two MOSFET's per stage where the MOSFET's are gated by a clock pulse to conduct the output of a preceding RS flip-flop to a subsequent RS flip-flop.

INVENTOR.
STEPHEN P.F. MA,
BY
Bernard P. Drachlis
ATTORNEY.

MOSFET STATIC SHIFT REGISTER

BACKGROUND OF THE INVENTION

This invention relates generally to semiconductor circuits and more particularly to shift register circuits constructed using metal oxide semiconductor field effect transistor (MOSFET) techniques.

MOSFET circuits have been used in the past to construct shift registers. However, common prior art devices utilized a master slave technique which required two flip-flops for each stage of the register. Of course, other equally complex techniques have been used, depending upon the operating parameters of the circuit.

SUMMARY OF THE INVENTION

The present invention is a static shift register which can also be fabricated as a counter and which readily lends itself to being constructed by metal oxide semiconductor field effect transistor (MOSFET) techniques on a monolithic semiconductor substrate. More particularly, the shift register has one MOSFET flip-flop per stage. Coupled between adjacent stages are two MOSFET gating transistors which are operably responsive to a clock pulse to gate the signals between stages. This results in a saving of several transistors per stage over prior art techniques, which is very important for integrated circuits.

In a preferred embodiment only one flip-flop is set at any one time. The remaining flip-flops are reset. In operation, the set state is transferred sequentially from one flip-flop to the next as clock pulses are applied to the shift register flip-flops and gating transistors. Additionally, a ring counter can be fabricated by feeding the outputs of a last stage back to the inputs of a first stage through two MOSFET gating transistors.

DESCRIPTION OF THE DRAWINGS

The above and other novel features and advantages of the invention will become more apparent from the following detailed description when taken in conjunction with the accompanying drawings in which.

DESCRIPTION OF THE PREFERRED EMBODIMENT

The embodiment of the invention will be described in terms of a negative logic system where ground voltage level indicates a logic "0" and a relatively negative voltage level indicates a logic "1". It will be clear to those skilled in the art that a positive logic system could be used with appropriate changes in the supply voltages applied to the circuitry and an enhancement mode P-type substrate. All parts of the circuit can be constructed on one semiconductor substrate using standard MOSFET techniques. The MOSFET circuit is constructed to operate in the enhancement mode with an N-type substrate. This means that for a MOSFET transistor to conduct, the gate voltage will be negative with respect to the source voltage. The logic levels used for the circuit are ground to indicate a logic "0" and a negative voltage which may be −15 v, for example, to indicate a logic "7." The drain supply voltage $-V_{DD}$ is at the logic "1" voltage level. The gate supply voltage $-V_{GG}$ for the resistors is more negative than $-V_{DD}$ and may be at −30 v., for example. This means that for a transistor to conduct, a logic "1" will be applied to the gate of the transistor.

Figure 1:
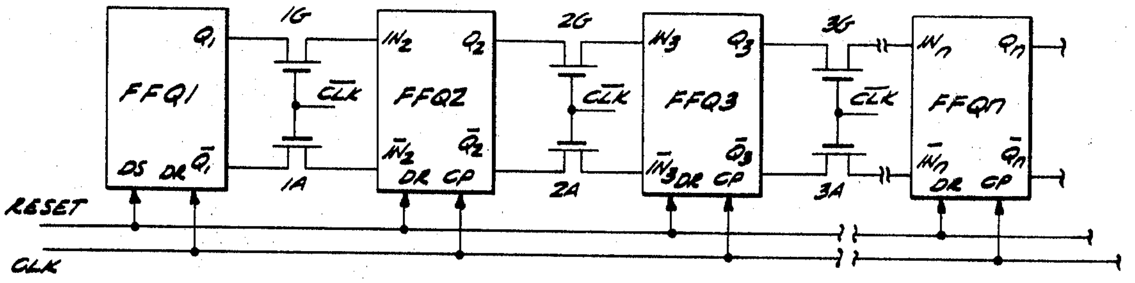
FIG. 1 is a logic diagram illustrating a static shift register embodying features of the invention.

Referring now to FIG. 1, there is shown a series of flip-flops interconnected by having the set output Q and reset output $\overline{Q}$ of each flip-flop coupled to be gated through MOSFET gating transistors to the set input IN and reset input $\overline{IN}$, respectively, of the next succeeding flip-flop. All flip-flops in the series except the first flip-flop are operable to be reset when a logic "1" RESET signal is applied to the RESET line by having the RESET line connected to the direct reset input DR of the flip-flops. The first flip-flop is operable to be set when a logic "1" signal is applied to the RESET line by having the RESET line connected to the direct set input DS of the first flip-flop. This will allow the first flip-flop to be set while the other flip-flops are reset, which will establish the initial conditions for the counter.

Figure 2:
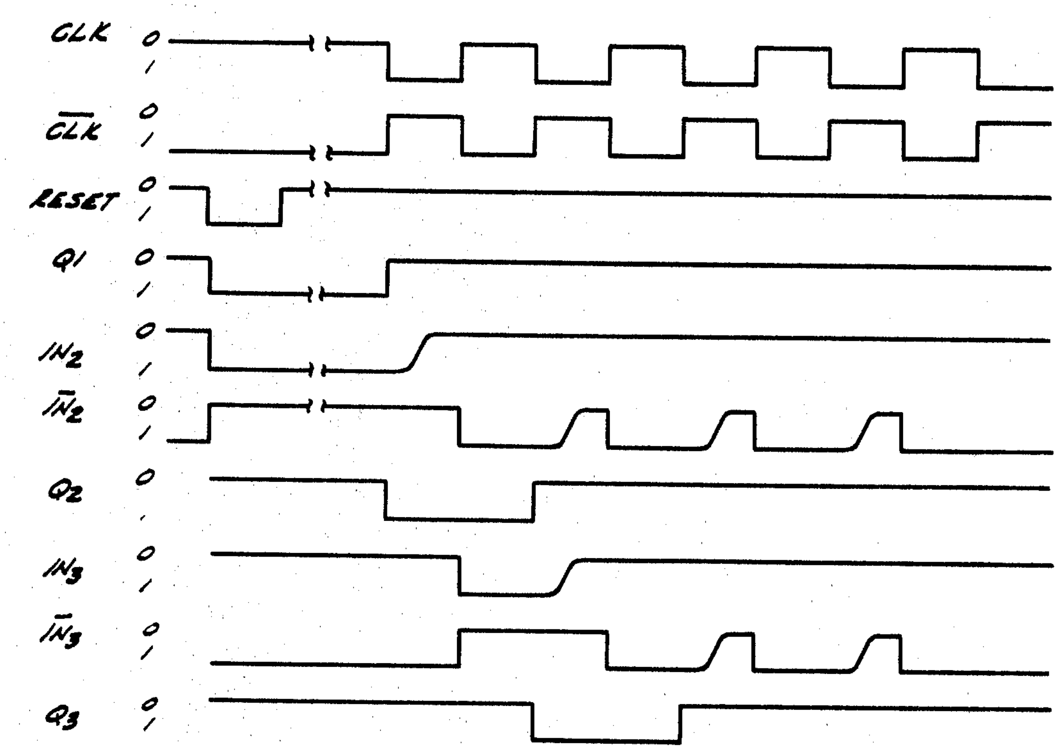
FIG. 2 is a graph illustrating the signal waveforms associated with the operation of the static shift register illustrated in FIG. 1.

The operation of the counter will be more clearly understood by reference to the waveforms of FIG. 2. The RESET pulse is applied to the circuit to set initial conditions. This will set flip-flop Q1, as shown by the set output waveform labeled Q1. At some time later, the clock pulses CLK and inverted clock pulses $\overline{CLK}$ will be received as shown by waveforms labeled CLK and $\overline{CLK}$, respectively. The flip-flops are operable to change states in response to the signals applied to the inputs IN and $\overline{IN}$ when the clock pulse signal CLK is at a logic "1" level. The inputs to subsequent flip-flops are gated by gating MOSFET's coupled between the outputs of a preceding stage and the inputs of any adjacent subsequent stage, and which are turned on when the inverted clock pulse signal $\overline{CLK}$ applied to the gates of the MOSFET gating transistors is at a logic "1" level.

When a RESET signal is applied to the RESET line, flip-flop Q1 will be set. Before the clock pulse signals begin, the signal CLK on the clock pulse line will be at a logic "O" level and the signal $\overline{CLK}$ on the inverted clock pulse line will be at a logic "1." This will allow the logic "1" signal on the set output $Q_1$ of flip-flop Q1 to be gated through the source and drain terminals, sometimes hereafter referred to as the signal terminals, of a MOSFET gating transistor 1G to the set input $IN_2$ of a succeeding flip-flop Q2. This will also allow a logic "0" signal from the reset output $\overline{Q_1}$ of the flip-flop Q1 to be gated through the source and drain terminals, sometimes hereafter referred to as the signal terminals, of a MOSFET gating transistor 1A to the reset input $\overline{IN_2}$ of the succeeding flip-flop Q2. The signals applied to the set and reset inputs $IN_2$ and $\overline{IN_2}$ of the flip-flop Q2 are shown by the waveforms labeled $IN_2$ and $IN_2$, respectively. Now, when the clock pulse signals CLK and CLK begin, the clock pulse signal CLK will begin to go from logic "o" to logic "1" level. At the same time, the inverted clock pulse signal $\overline{CLK}$ will begin to go from logic "1" to a logic "0" level. Since the inverted clock pulse signal $\overline{CLK}$ is going to a logic "0," the signals $Q_1$ and $\overline{Q_1}$ being gated through the MOSFET gating transistors 1G and 1A will be turned off. The signal applied to the set input $IN_2$ to the flip-flop Q2 will begin to go to a logic "0" voltage level. This signal will not have an immediate transition to the logic "0" level due to the advantageous capacitance characteristic and the leakage current limit associated with the MOSFET input circuitry of the flip-flop Q2, as will be explained in more detail later. Also, the signal applied to the reset input $\overline{IN_2}$ of the flip-flop Q2 will stay at logic "0" level, as will be explained in more detail later. Thus the signals on the inputs to the flip-flop Q2 will have transition times to their new logic levels which are much slower than the transition time of the clock pulse signal being applied to the flip-flop. Thus, the clock pulse signal CLK will be at a logic "1" level before the signals on the $IN_2$ and $\overline{IN_2}$ inputs to the flip-flop effectively change their logic level. This will allow the flip-flop Q2 to be set as shown by the waveform labeled Q2 in FIG. 2. The flip-flop Q1 is operable to be reset when the first clock pulse goes to the logic "1" level by having the clock pulse signal CLK applied to the direct reset input DR of flip-flop Q1. Therefore, flip-flop Q1 will be reset when flip-flop Q2 is being set.

Thereafter, when the clock pulse signal CLK goes back to the logic "0" level, the inverted clock pulse signal $\overline{CLK}$ will go to the logic "/" level and will gate the set output $Q_2$ of the flip-flop Q2 through the signal terminals of a MOSFET gating transistor 2G to the set input $IN_3$ of a succeeding flip-flop Q3. In a similar manner, the reset output $\overline{Q_2}$ of the flip-flop Q2 will be gated through the signal terminals of a MOSFET gating transistor 2A to the reset input of the succeeding flip-flop Q3. This is shown as the waveforms $IN_3$ and $\overline{IN_3}$ in FIG. 2. Also, since the flip-flop Q1 has been reset, the set input $IN_2$ to the flip-flop Q2 the set flip-flop Q2 during the time the first clock pulse returns to a logic "0" level will be at a logic "0" level. Also, since the flip-flop Q1 has been reset, its reset output $\overline{Q_1}$ will be at a logic "1" level. This will mean that the reset input $\overline{IN_2}$ to the flip-flop Q2 will go between logic "1" and logic "0" as the inverted clock 0" signal $\overline{CLK}$ gates the flip-flop Q1 reset output $\overline{Q_1}$ ¼to the reset input $\overline{IN_2}$. When the next clock pulse goes to a logic "1" level and the inverted clock pulse goes to the logic "0" level, the flip-flop Q3 will be set in a manner exactly the same as previously described for the flip-flop Q2 which was previously set. The flip-flop Q2 will also be rest in response to the inputs from the flip-flop Q1.

The succeeding flip-flops in the register will be set and reset in exactly the same manner as that described above when subsequent clock pulses are applied to the shift register.

Figure 3:
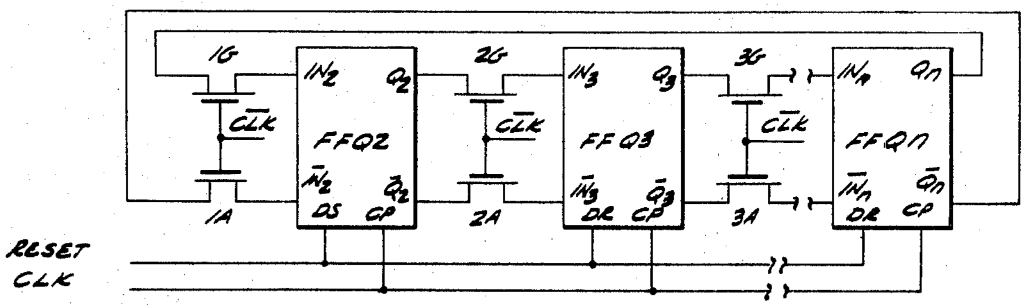
FIG. 3 is a logic diagram illustrating a circulating register including the static shift register.

The shift register can be converted to a circulating counter shown in FIG. 3 by eliminating the first stage flip-flop Q1 and applying the outputs $Q_n$ and $\overline{Q_n}$ of the last stage flip-flop Qn of the register to the set and reset inputs $IN_2$ and $\overline{IN_2}$, respectively, of the flip-flop Q2 through the signal terminals of the MOSFET gating transistors 1G and IA, respectively. A slight modification to any one of the flip-flops in the counter is required to force one flip-flop to a set condition when a RESET signal is applied to the counter. For example, this can be accomplished by connecting the RESET line to the direct set input DS of the flip-flop Q2 as shown in FIG. 3. This will establish the initial conditions for the counter. Now, set condition will circulate serially through the flip-flop as long as clock pulses are applied to the counter.

Figure 4:
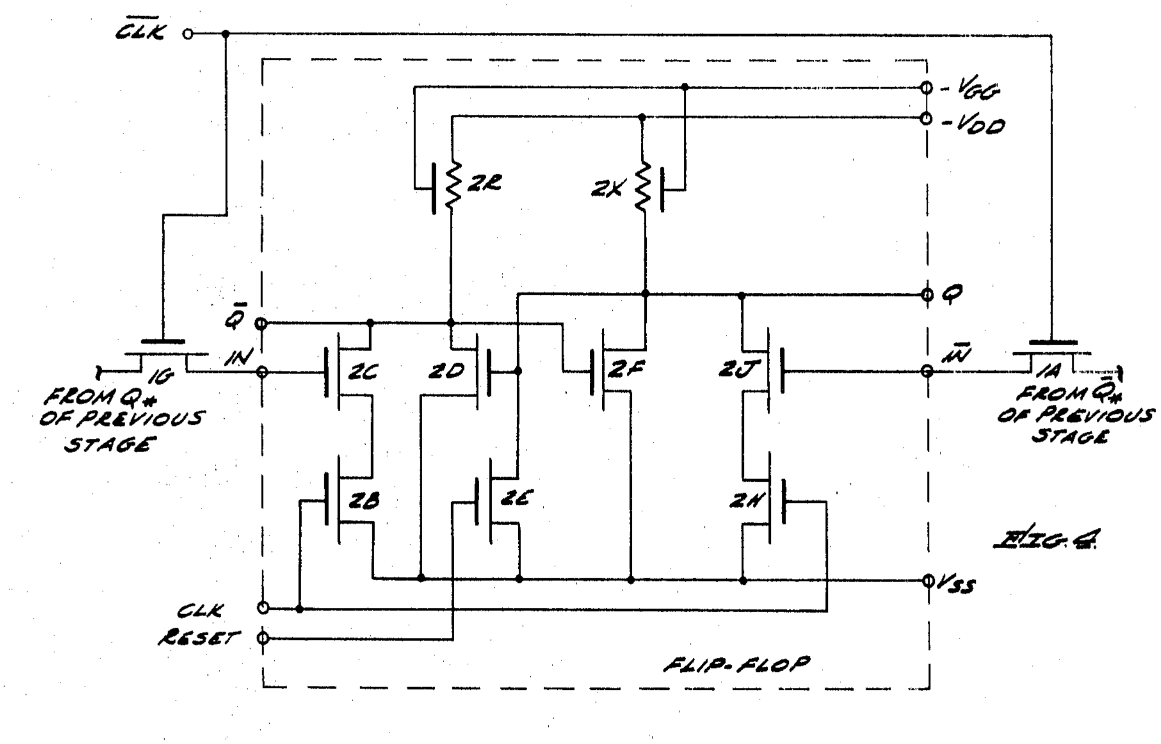
FIG. 4 is a circuit diagram illustrating a flip-flop that can be used in practicing the invention.

Referring now to FIG. 4, there is shown a standard MOSFET flip-flop which can be used for all but the first flip-flop in the counter shown in FIG. 1 and can be used for all flip-flops of the circulating counter of FIG. 3. The same circuitry can be used for the one flip-flop in circulating counter of FIG. 3 that is to be initially set by simply reversing all inputs and outputs, that is, the set input becomes the reset input, the reset input becomes the set input, the direct reset input becomes the direct set input, the set output becomes the reset output, and the reset output becomes the set output. The flip-flop includes two MOSFET transistors 2D and 2F and their associated MOS field controlled resistors 2R and 2X interconnected in a standard cross-coupled flip-flop arrangement. The gate of the MOSFET transistor 2D is connected to the set output Q of the flip-flop. The gate of the MOSFET transistor 2F is connected to the reset output $\overline{Q}$ of the flip-flop.

A MOSFET transistor 2E operates as a direct reset for the flip-flop when a logic "1" signal is applied on the RESET line to the gate thereof. This allows the MOSFET transistor 2E to conduct and provides a path to ground level $V_{SS}$ for the set output node Q. This also means that the gate of the MOSFET transistor 2D will be coupled to ground. This will prevent the MOSFET transistor 2D from conducting. This will mean that the logic "1" voltage level $-V_{DD}$ will show through the MOS field controlled resistor 2R to the reset output node $\overline{Q}$ and to the gate of the MOSFET transistor 2F. This will allow the MOSFET transistor 2F to conduct and will provide a continuous path to ground for the set output node Q to keep the flip-flop in the reset state.

The flip-flop includes MOSFET transistors 2B and 2C having their source and drain terminals interconnected in series between the source voltage $V_{SS}$ and the reset output node $\overline{Q}$. The flip-flop also includes MOFsFET transistors 2H and 2J having their source and drain terminals interconnected in series between the source voltage $V_{SS}$ and the set output node Q of the flip-flop. The gates of the MOSFET transistors 2B and 2H are connected to the clock pulse line. The gate of the transistor 2C receives an input signal from the set output $Q_*$ of the previous stage gated through a MOSFET gating transistor 1G in response to the inverted clock pulse signal $\overline{CLK}$. The gate of the transistor 2J receives an input signal from the reset output $\overline{Q_*}$ of the previous stage gated through a MOSFET gating transistor 1A in response to the inverted clock pulse signal $\overline{CLK}$. Disregarding for a moment the effect of the MOSFET gating transistors 1G and 1A, if the set outputs $Q_*$ of the previous stage of the counter is a logic "1" level, a logic "1" signal will be applied to the gate of the MOSFET transistor 2C and will allow the MOSFET transistor 2C to conduct. This will also mean that the reset output $\overline{Q_*}$ of the previous stage of the counter will be a logic "0." This will mean that a logic "0" will be applied to the gate of the MOSFET transistor 2J and will prevent the MOSFET transistor 2J from conducting. Now when the clock pulse signal CLK goes to a logic "1," the MOSFET transistors 2B and 2H will conduct. Since the MOSEFET transistor 2J is not conducting, the fact that the MOSEFT transistor 2H is conducting will have no effect on the remainder of the circuit. However, since the MOSFET transistor 2C is conducting, when the MOSFET transistor 2B conducts, this will establish a path to ground $V_{SS}$ from the reset output node $\overline{Q}$. This will apply to a ground level signal to the gate of the MOSFET transistor 2F and turn this transistor off. This will mean that the logic "1" voltage level $-V_{DD}$ will show through the MOSFET resistor 2X and be applied to the gate of the MOSFET transistor 2D and also be applied to the set output node Q of the flip-flop. The logic "1" signal being applied to the gate of the MOSFET transistor 2D will turn on the MOSFET transistor 2D which will establish a path to ground for the reset output node $\overline{Q}$ of the flip-flop to keep the flip-flop in the set state. In this way the flip-flop will change states.

Now the effect of the MOSFET gating transistors 1G and 1A will be explained. Assume that the flip-flop is reset. This will mean that the MOSFET transistor 2F is conducting and the MOSFET transistor 2D is not conducting. The logic "1" level $-V_{DD}$ will show through the MOS field controlled resistor 2R to the reset output node $\overline{Q}$. Assume further that the set output $Q_*$ of the previous stage is at a logic "1" level. This will mean that when the MOSFET gating transistor 1G is conducting, the logic "1" level from the set output $Q_*$ of the previous stage will be applied to the gate of the MOSFET transistor 2C as the set input IN. This will allow the MOSFET transistor 2C to conduct. Recall that the MOSFET gating transistor 1G will conduct when the inverted clock pulse signal $\overline{CLK}$ is at a logic "1" level. At this time, the clock pulse signal CLK is at a logic "0" level. This will mean that when the logic "1" level is applied to the gate of the MOSFET transistor 2C, the gate of the MOSFET transistor 2B will be at a logic "0" level, and the MOSFET's transistor 2B will not conduct. Now when the clock pulse signal CLK goes to a logic "1" level, it will be applied to the gate of the MOSFET's transistor 2B and will allow the MOSFET's transistor 2B to conduct. At the same time, the inverted clock pulse signal $\overline{CLK}$ will go to a logic "0" level and will turn off the MOSFET's gating transistor 1G. However, the capacitance characteristics and leakage current limits of the gate of the MOSFET's transistor 2C are used to advantage and will allow the signal to remain on the gate of the MOSFET transistor 2C for some time after MOSFET gating transistor 1G has stopped conducting. This time is sufficient to allow the ground level path through the series MOSFET transistors 2C and 2B to be applied to the reset output node $\overline{Q}$ of the flip-flop and allow the flip-flop to change states. In this way, the flip-flop will change states before the signal on the gate of the MOSFET transistor 2C decays to a logic "0" level to turn off the transitor 2C. The input from the reset output $\overline{Q_*}$ of the previous stage gated through the MOSFET gating transistor 1A to the gate of the MOSFET transistor 2J works in exactly the same manner as described above for the set input.

Figure 5:
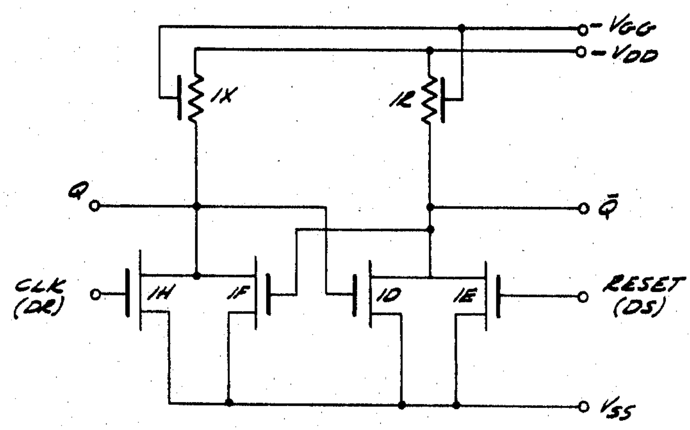
FIG. 5 is a circuit diagram illustrating a flip-flop which can be used as the first stage of the shift register to obtain a flip-flop set when the remainder of the register stages are reset.

FIG. 5 shows a flip-flop that may be used for the first stage of the shift register of FIG. 1. This is a basic flip-flop arrangement of MOSFET transistor 1F and 1D with their associated MOS field controlled resistors 1X and 1R, respectively. The flip-flop also includes a direct set input DS applied to the gate of a MOSFET transistor 1E having its source and drain coupled in parallel with the source and drain of the MOSFET transistor 1D. Similarly, a direct reset input DR is applied to the gate of a transistor 1H having its source and drain coupled in parallel with the source and drain of the MOSFET transistor 1F. When a logic "1"level is applied to the direct set input DS, the transistor 1E conducts and provides a path to ground for the reset output node $\bar{Q}$ which will set the flip-flop. A logic "1" level applied to the direct reset input DR will reset the flip-flop in an analogous manner.

In view of the above detailed description, it should now be apparent that the circuit has the advantage that it can be constructed entirely by conventional MOSFET integrated circuit techniques as a monolithic integrated circuit member.

Although the invention has been described in terms of having only one flip-flop stage set at a time, it will be apparent to those skilled in the art that any type of input circuit may be used in place of the flip-flop $Q_1$ in FIG. 1 to apply any combination of bits to the shift register at successive clock pulse signals.

What I claim is:

1. A static shift register of the type that can be constructed on a monolithic semiconductor substrate by metal oxide semiconductor field effect transistor techniques which comprises:

a series of MOSFET flip-flop ages, each of said MOSFET flip-flop stages having a set input, a first reset input, a second reset input, a set output, a reset output, and a clock pulse input, each of said flip-flop stages being operable to be reset in response to a reset signal applied to its second reset input and to change stages according to signals applied to its set input and its first reset input when a clock pulse signal is applied to its clock pulse input; and a plurality of MOSFET gating transistors, each of said MOSFET gating transistors having a firs signal terminal, a second signal terminal, and a gate terminal, an individual one of said plurality of MOSFET gating transistors having its first signal terminal connected to the set input of an individual one of said series of MOSFET flip-flop stages and having its second signal terminal connected to the set output of the preceding MOSFET flip-flop stage, another individual one of said plurality of MOSFET gating transistors having its first signal terminal connected to the reset input of said individual one of said series of MOSFET flip-flop stages and having its second signal terminal connected to the reset output of said preceding MOSFET flip-flop stage, said MOSFET gating transistors being further respsonsive to an inverted clock pulse signal applied to the gate terminals of said plurality of MOSFET gating transistors for conducting the signals on the set and reset outputs of a MOSFET flip-flop stage to the set and reset inputs, respectively, of the succeeding MOSFET flip-flop stage.

2. A static shift register as claimed in claim 1 which further includes:

input means for applying signals to the second signal terminals of the MOSFET gating transistors having their first signal terminals connected to the set and reset inputs of the first of said series of MOSFET flip-flop stages.

3. A static shift register as claimed in claim 2 wherein said input means includes:

a MOSFET flip-flop stage having a set input and a reset input, said MOSFET flip-flop stage operable to be set in response to said reset signal applied to its set input and to be reset in response to said clock pulse signal applied to its reset input.

4. A static shift register as claimed in claim 2 wherein:

said input means is the set and reset output signals from the last of said series of MOSFET flip-flop stages; and at least one of said series of MOSFET flip-flop stages is operable to be set in response to said reset signal.

5. A static shift register as claimed in claim 1 wherein:

the capacitance of the set input and the first reset input of each of said MOSFET flip-flop stages is operable to retain the set output signal and reset output signal of the previous MOSFET flip-flop stage on the set input and first reset input, respectively, of said flip-flop stage for some time after said plurality of MOSFET gating transistors have stopped conducting.

PO-1050
(5/69)

UNITED STATES PATENT OFFICE
CERTIFICATE OF CORRECTION

Patent No. 3,593,032 Dated July 13, 1971

Inventor(s) Stephen P. F. Ma

It is certified that error appears in the above-identified patent and that said Letters Patent are hereby corrected as shown below:

In the Abstract: "MOSFET's" should be --MOSFETs--;
Col. 1, line 71, "7" should be --"1"--;
Col. 2, line 46, "$IN_2$" should be --$\overline{IN_2}$--;
line 47, "CLK" should be --$\overline{CLK}$--;
line 75, "/" should be --"1"--;
Col. 3, line 8, "the set flip-flop Q2" should be deleted;
line 13, "0" should be --pulse--;
line 14, "1/4" should be deleted;
line 19, "rest" should be --reset--;
line 24, after "counter" insert --as--;
line 35, after "Now," insert --the--;
line 42, before "circulating" insert --the--;
line 71, "MOFsFET" should be --MOSFET--;
Col. 4, line 1, "$Q_=$" should be --$Q_*$--;
line 8, "outputs $Q_=$" should be --output $Q_*$--;
line 18, "MOSEFET" should be --MOSFET--;
line 19, "MOSEFT" should be --MOSFET--;
line 24, after "apply" delete "to";
line 43, "$Q_=$" should be --$Q_*$--;
line 52, "MOSFET's" should be --MOSFET--;
line 55, "MOSFET's" should be --MOSFET--;
line 56, "MOSFET's" should be --MOSFET--;
line 58, "MOSFET's" should be --MOSFET--;
line 60, "MOSFET's" should be --MOSFET--;
line 62, before "MOSFET" insert --the--;
Col. 5, line 1, "transistor" should be --transistors--;
line 4, "IE" should be --1E--;
line 29, "ages" should be --stages--;
line 34, "stages" should be --states--;
line 38, "firs" should be --first--.

Signed and sealed this 23rd day of January 1973.

(SEAL)
Attest:

EDWARD M.FLETCHER,JR.
Attesting Officer

ROBERT GOTTSCHALK
Commissioner of Patents